United States Patent
Hill et al.

(10) Patent No.: US 10,658,204 B2
(45) Date of Patent: *May 19, 2020

(54) SPIN CHUCK WITH CONCENTRATED CENTER AND RADIAL HEATING

(71) Applicant: Lam Research AG, Villach (AU)

(72) Inventors: Bridget Hill, Villach (AU); Michael Puggl, Villach (AU); Gerhard Mueller, Drobollach (AU); Henry Roger Osner, Villach (AU); Karl-Heinz Hohenwarter, Dellach/Gail (AU); Ulrich Tschinderle, Villach (AU); Daniel Brien, Villach (AU)

(73) Assignee: LAM RESEARCH AG, Villach (AT)

( * ) Notice: Subject to any disclaimer, the term of this patent is extended or adjusted under 35 U.S.C. 154(b) by 240 days.

This patent is subject to a terminal disclaimer.

(21) Appl. No.: 15/671,410

(22) Filed: Aug. 8, 2017

(65) Prior Publication Data
US 2019/0051541 A1    Feb. 14, 2019

(51) Int. Cl.
*H01L 21/67* (2006.01)
*H01L 21/687* (2006.01)

(52) U.S. Cl.
CPC .. *H01L 21/67051* (2013.01); *H01L 21/67115* (2013.01); *H01L 21/68728* (2013.01); *H01L 21/67034* (2013.01); *H01L 21/6875* (2013.01)

(58) Field of Classification Search
CPC ......... H01L 21/67051; H01L 21/68728; H01L 21/67115; H01L 21/67034; H01L 21/6875
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,038,064 A | 3/2000 | Kanao et al. | |
| 6,485,531 B1 | 11/2002 | Schob | |
| 8,821,681 B2 | 9/2014 | Puggl et al. | |
| 8,997,764 B2 | 4/2015 | Puggl | |
| 9,245,777 B2 | 1/2016 | Plazonic et al. | |
| 9,368,347 B2* | 6/2016 | Dimitriadis | G03F 7/2028 |
| 10,312,117 B2* | 6/2019 | Si | H01L 21/67115 |
| 2008/0280453 A1* | 11/2008 | Koelmel | H01L 21/67115 438/758 |
| 2012/0160274 A1* | 6/2012 | Kasai | H01L 21/67028 134/26 |
| 2013/0284095 A1 | 10/2013 | Ranish | |

(Continued)

FOREIGN PATENT DOCUMENTS

WO    WO-2007/101764 A1    9/2007

*Primary Examiner* — Benjamin L Osterhout (57) ABSTRACT

A substrate processing system to treat a substrate includes a spin chuck configured to hold and rotate a substrate. A heating assembly is configured to heat an opposite surface of the substrate and includes a main heater assembly and a nozzle stack cap. The main heater assembly includes a first plurality of light emitting diodes (LEDs) arranged on a first printed circuit board (PCB) in a first plane that is spaced from and parallel to a second plane including the substrate. The nozzle stack cap assembly includes at least one nozzle to dispense liquid onto a center of a first surface of the substrate. A radiant heat source is arranged closer to the substrate than the first plane and is configured to heat the center of the first surface of the substrate.

18 Claims, 9 Drawing Sheets

(56) References Cited

U.S. PATENT DOCUMENTS

| | | |
|---|---|---|
| 2014/0263268 A1 | 9/2014 | Cong et al. |
| 2014/0339215 A1 | 11/2014 | Plazonic et al. |
| 2015/0204491 A1 | 7/2015 | Yuan et al. |
| 2016/0379853 A1* | 12/2016 | Schaller ............ H01L 21/67115 |
| | | 361/234 |
| 2017/0345681 A1 | 11/2017 | Mui et al. |
| 2018/0047596 A1 | 2/2018 | Si et al. |

* cited by examiner

SPIN CHUCK WITH CONCENTRATED CENTER AND RADIAL HEATING

FIELD

The present disclosure relates to systems and methods for treating substrates, and more particularly to systems and methods for treating a substrate using a spin chuck.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to treat substrates such as semiconductor wafers. Examples include wet or dry treatments for drying, etching, cleaning, polishing and/or material deposition. In some applications, a spin chuck uses a liquid dispenser including one or more liquid nozzles to dispense a treatment liquid onto a substrate as the substrate is rotated. As feature sizes decrease and aspect ratios increase, pattern collapse may occur when performing wet treatment such drying of the substrates.

Figure 1A:
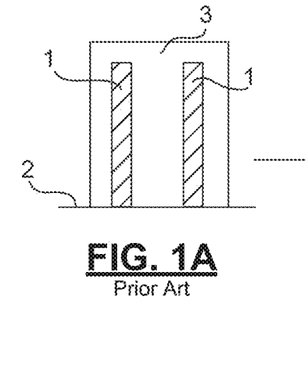
FIGS. 1A-1C illustrate a substrate including features during drying according to the prior art.
Figure 1B:
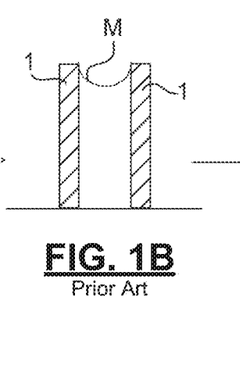
Figure 1C:
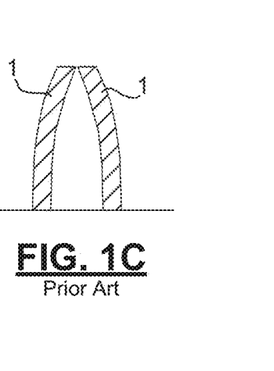

Referring now to FIGS. 1A-1C, a substrate 2 includes features 1. In some examples, the features 1 include high aspect ratio (HAR) features such as fins. During processing, the substrate 2 is rinsed with one or more liquids to remove processing liquids, reactants and/or particles. For example, the substrate 2 can be rinsed with deionized (DI) water and isopropyl alcohol (IPA), as shown at 3 in FIG. 1A surrounding the features 1.

As the substrate 2 is dried, the IPA 3 evaporates. However, surface tension and the high aspect ratio of the features 1 causes the IPA 3 to be removed more slowly from spaces between the features 1. A meniscus may be formed as shown at M in FIG. 1B. As drying of the substrate 2 continues, the surface tension of the IPA 3 pulls the features 1 toward each other as shown in FIG. 1C, which causes leaning of the fins and defects.

Some processes attempt to reduce pattern collapse by using a rinse liquid such as IPA that has a lower surface tension than DI water. Additionally the rinsing can be performed at an elevated temperature. These approaches have had a limited effect on reducing pattern collapse.

SUMMARY

A substrate processing system to treat a substrate includes a spin chuck configured to hold and rotate a substrate. A heating assembly is configured to heat an opposite surface of the substrate and includes a main heater assembly and a nozzle stack cap. The main heater assembly includes a first plurality of light emitting diodes (LEDs) arranged on a first printed circuit board (PCB) in a first plane that is spaced from and parallel to a second plane including the substrate. The nozzle stack cap assembly includes at least one nozzle to dispense liquid onto a center of a first surface of the substrate. A radiant heat source is arranged closer to the substrate than the first plane and is configured to heat the center of the first surface of the substrate.

In other features, the radiant heat source is arranged in a third plane that is between the first plane and the second plane. A controller actuates the first plurality of LEDs in radial and circumferential zones to create a moving heat front.

In other features, the radiant heat source of the nozzle stack cap assembly is connected to one of the one of the radial and circumferential zones. The nozzle stack cap assembly includes a second plurality of LEDs that is arranged on a second PCB. The second PCB is arranged in a third plane that is parallel to the first plane and the second plane and is closer to the second plane than the first plane.

In other features, the nozzle stack cap assembly includes a transparent cover arranged over the radiant heat source. A first hole is formed in the transparent cover. A first conduit passes through the first hole to deliver liquid to the first surface of the substrate. The nozzle stack cap assembly includes a second hole formed in the transparent cover and a second conduit passing through the second hole to deliver gas to the first surface of the substrate.

In still other features, the nozzle stack cap assembly includes a second PCB including a second plurality of LEDs. A body supports the second PCB and defines cooling fins. A transparent cover is arranged over the second PCB. A first hole is formed in the second PCB, the body and the transparent cover. A second hole is formed in the second PCB, the body and the transparent cover. A first conduit is arranged in the first hole to deliver liquid. A second conduit is arranged in the second hole to deliver gas.

In other features, a connector connects the second PCB to the first PCB. The nozzle stack cap assembly includes a body. The radiant heat source includes a laser end connector connected to the body. The laser end connector is slidably connected to the body to allow axial movement relative to the substrate.

In other features, the nozzle stack cap assembly further comprises a transparent cover connected to the body. A first hole is formed in the body and the transparent cover. A second hole is formed in the body and the transparent cover. A first conduit is arranged in the first hole to deliver liquid. A second conduit is arranged in the second hole to deliver gas.

In other features, fiber is connected to the laser end connector. A connector is connected to the fiber. A laser is connected to the connector.

In other features, a transparent plate includes a center opening and rotates with the spin chuck. The main heater assembly is located below the transparent plate and the nozzle stack cap assembly is connected to the main heater assembly and is partially arranged in the center opening.

In other features, a laser end connector directs light on a radially outer edge of the substrate. Fiber is connected to the laser end connector. A connector is connected to the fiber. A laser is connected to the connector. The laser end connector is arranged on the PCB. The transparent plate includes arcuate openings and wherein light generated by the laser end connector passes through the arcuate openings.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Rapid localized heating of the substrate along a moving heat front can be used to evaporate rinse liquid on the substrate sufficiently quickly such that a meniscus is not formed and pattern collapse is reduced or avoided. Examples of this approach are shown and described in commonly-owned U.S. patent application Ser. No. 15/169,330, filed on May 31, 2016, which is entitled "Method and Apparatus for Processing Wafer Shaped Articles" and which is hereby incorporated by reference in its entirety.

While the spin chuck described therein includes a radiant heating assembly with a large number of zones each including high-power light emitting diodes (LEDs), it has proven to be difficult to sufficiently heat a center portion of the substrate to rapidly evaporate rinse liquid in some applications. This is due in part to a location of a nozzle stack cap assembly under a center portion of the substrate. During the drying step, a meniscus opens from a center of the substrate where the drying liquid is first dispensed. Due to the lack of LEDs directly underneath the center of the substrate, a sufficiently high temperature cannot be reached in some applications to eliminate leaning of the features in the center area when the meniscus is formed. Lenses may be used to refract light towards the center of the substrate. However, the heating is insufficient in some applications.

Systems and methods according to the present disclosure employ a radiant heating assembly including a nozzle stack cap assembly with LEDs or a laser end connector to provide rapid localized heating at a center portion of the substrate to rapidly evaporate the rinse liquid and to prevent formation of the meniscus. The nozzle stack cap assembly also delivers liquid and/or gas to a bottom surface of the substrate.

In some examples, the nozzle stack cap assembly positions nozzles and the laser end connector or a printed circuit board (PCB) including LEDs under a center portion of the substrate. In some examples, the nozzle stack cap assembly rests on and/or is connected to a main PCB associated with the main heater assembly. In some examples, the PCB of the nozzle stack cap assembly is connected to the main PCB and a controller for the main heater assembly. In some examples, the controller controls the LEDs in radial and/or circumferential zones to produce a moving heat front. In some examples, the LEDs associated with the nozzle stack cap assembly operate as a separate zone or part of a zone of the main heater assembly. In other examples, the LEDs associated with the nozzle stack cap assembly are connected to an external power supply and controller and are independently controlled.

The nozzle stack cap assembly can be adjusted to position the radiant heat source of the nozzle stack cap assembly closer or farther from the substrate, or to add additional LEDs to the nozzle stack cap assembly. The LEDs that are used for the nozzle stack cap assembly can be the same as or different than the LEDs used for the main heater assembly (for example, size, power output, wavelength, etc.).

Figure 2:
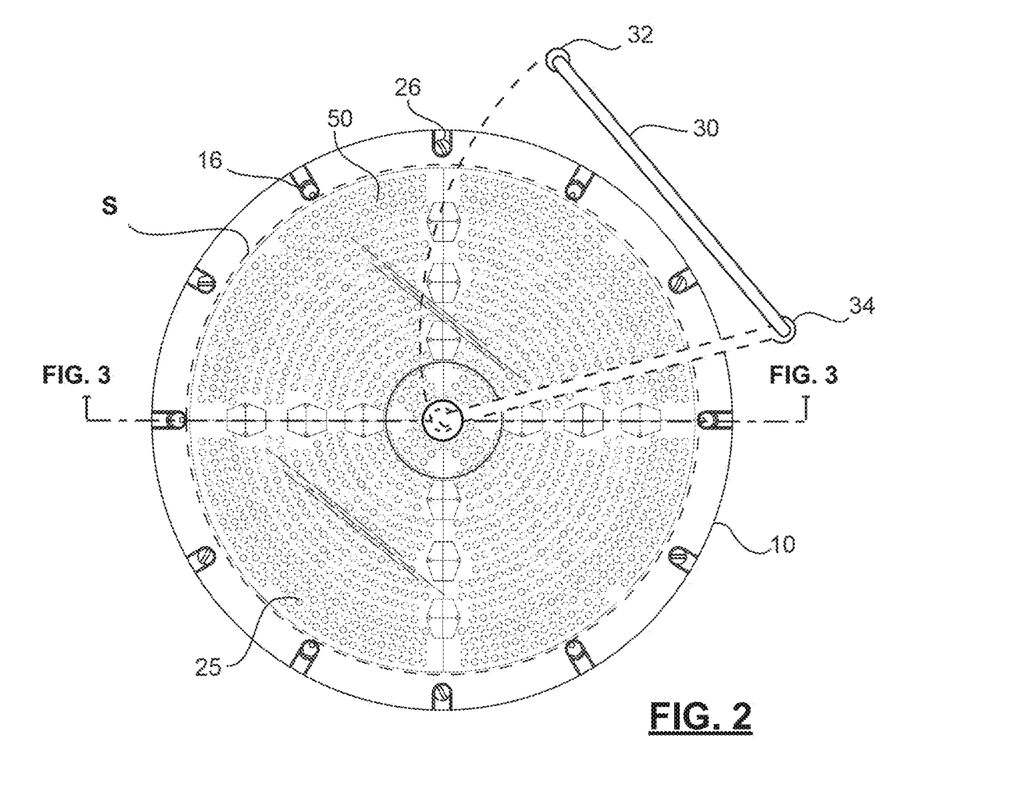
FIG. 2 is a plan view of an example of a spin chuck including a nozzle stack cap assembly with a radiant heat source such as a laser end connector or LEDs to provide concentrated central heating of a center portion of the substrate according to the present disclosure.

Referring now to FIG. 2, a spin chuck 10 is designed to hold and rotate a substrate S of a predetermined diameter, for example 300 mm or 450 mm. Substrate S is held by pins 16 that pass through openings in a transparent plate 25. The transparent plate 25 includes a center opening 27 (best seen in FIGS. 3 and 7).

In some examples, the transparent plate 25 is made of quartz or sapphire. The transparent plate 25 is secured to the spin chuck 10 by fasteners 26 and rotates with the spin chuck 10. When the substrate S is positioned on the spin chuck 10, it is held above the transparent plate 25 so that the lower surface of the substrate S is parallel to the transparent plate 25 and spaced therefrom by a predetermined gap. In some examples, the predetermined gap is in a range from 10 to 15 mm, although other dimensions can be used. In some examples, the predetermined gap is in a range from 12 to 13 mm, although other dimensions can be used. A radiant heating assembly 50 is partially located beneath the transparent plate 25 and portions thereof pass through the center opening 27 as will be described further below.

A boom swing arm 30 can be pivoted by a drive motor 34 relative to an upper surface of the substrate S. The boom swing arm 30 discharges liquid downwardly onto the substrate S through a discharge nozzle 32. The boom swing arm 30 is movable between a standby position and a central position. The discharge nozzle 32 can pivot across a full radius of the substrate S and when the substrate S is rotated by the spin chuck 10 to dispense liquid onto the upwardly-facing surface thereof.

Figure 3:
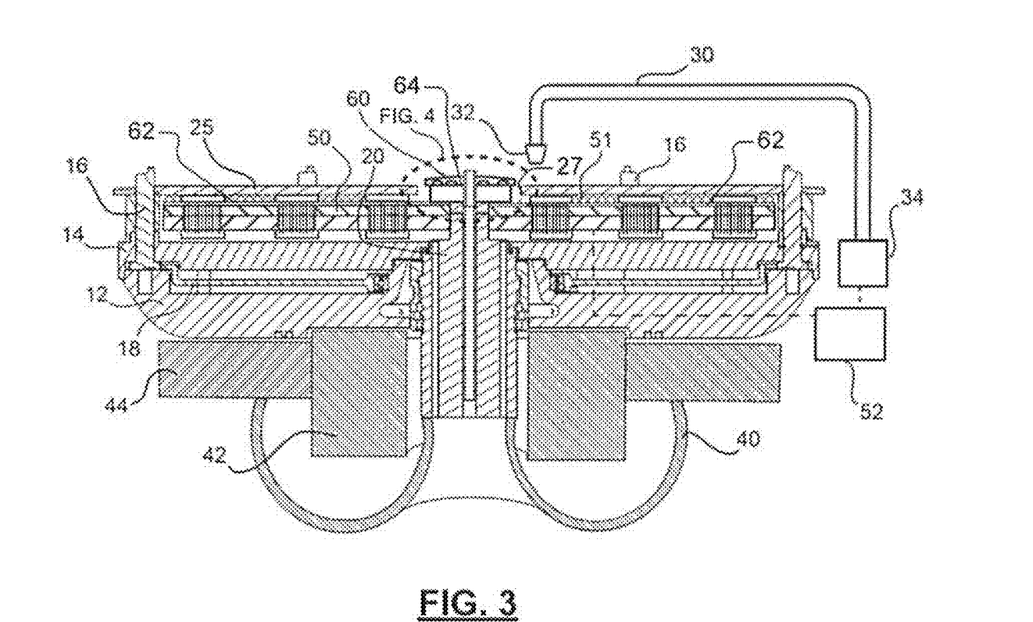
FIG. 3 is a side cross-sectional view of an example of a spin chuck including a nozzle stack cap assembly with a radiant heat source such as a laser end connector or LEDs to provide concentrated central heating of a center portion of the substrate according to the present disclosure.

Referring now to FIG. 3, the spin chuck 10 includes a lower chuck body 12 and an upper chuck body 14 that are connected together and rotate about a stationary post 20 that is located centrally relative to the substrate. The pins 16 and the transparent plate 25 rotate with the spin chuck 10. The ring gear 18 engages gear teeth on the pins 16. The ring gear 18 rotates relative to the spin chuck 10 to rotate the pins 16 and move the pins 16 between open and closed positions.

The stationary post 20 and a stator 44 are mounted on a machine frame 40. A rotor 42 is secured to the lower chuck body 12. In some examples, the stator 44 and rotor 42 form a magnetic motor that rotates the spin chuck 10. The radiant heating assembly 50 is mounted on the stationary post 20 and does not rotate. The radiant heating assembly 50 includes a main heater assembly 62 arranged below the transparent plate 25 and a nozzle stack cap assembly 60 connected to the main heater assembly 62 and including an upper portion that passes through the center opening 27 of the transparent plate 25.

In some examples, the main heater assembly 62 is generally located in a first plane that is parallel to and below a second plane including the substrate S. The nozzle stack cap assembly 60 is connected to the main heater assembly 62. The main heater assembly 62 includes LEDs 51 mounted in a direction facing the transparent plate 25. The nozzle stack cap assembly 60 also includes a radiant heat source 64 such as LEDs or a laser end connector, as will be described further below. In some examples, the radiant heat source 64 of the nozzle stack cap assembly 60 is arranged in a third plane that is located between the first plane including the main heater assembly 62 and the second plane including the substrate S. In some examples, a first distance from the first plane including the main heater assembly 62 to the third plane including the nozzle stack cap assembly 60 in a perpendicular direction is in a range from 5 to 13 mm, although other dimensions can be used. In some examples, a first distance from the first plane including the main heater assembly 62 to the third plane including the nozzle stack cap assembly 60 in a perpendicular direction is in a range from 7 to 10 mm, although other dimensions can be used. In some examples, a second distance from the third plane including the nozzle stack cap assembly 60 to the second plane including substrate S in a perpendicular direction is in a range from 10 to 17 mm, although other dimensions can be used. In some examples, the second distance from the third plane including the nozzle stack cap assembly 60 to the second plane including substrate S in a perpendicular direction is in a range from 13 to 14 mm, although other dimensions can be used.

A controller 52 may be used to control power to the LEDs 51 and the radiant heat source 64. The controller 52 also controls the drive motor 34 to pivot the boom swing arm 30 relative to the substrate S. The controller 52 may also control rotation of the spin chuck 10. In some examples, the controller 52 controls power to the LEDs 51 in a plurality of radial and/or circumferential zones to provide rapid localized heating along a moving heat front.

Figure 4:
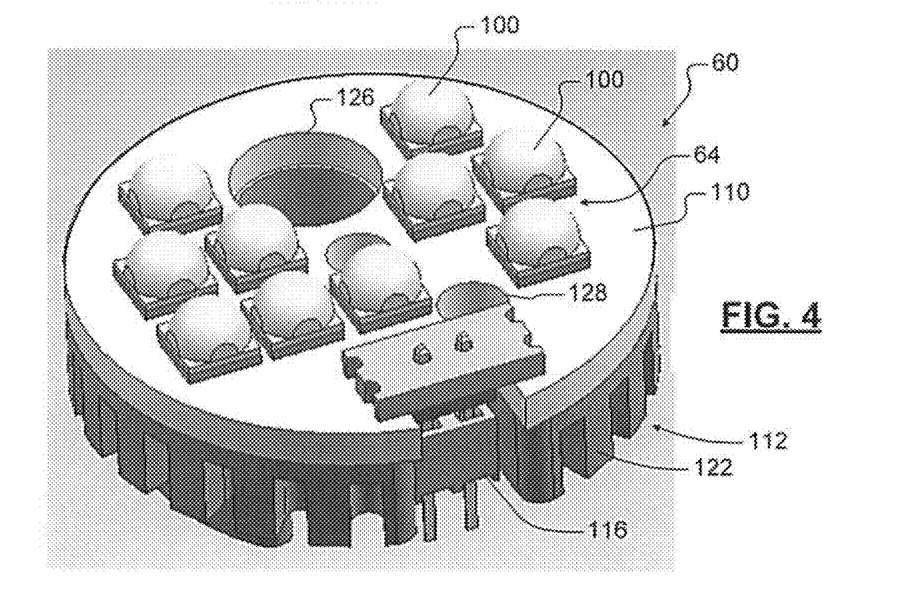
FIGS. 4-5 are perspective views illustrating an example of a nozzle stack cap assembly without and with a transparent cover, respectively, according to the present disclosure.
Figure 5:
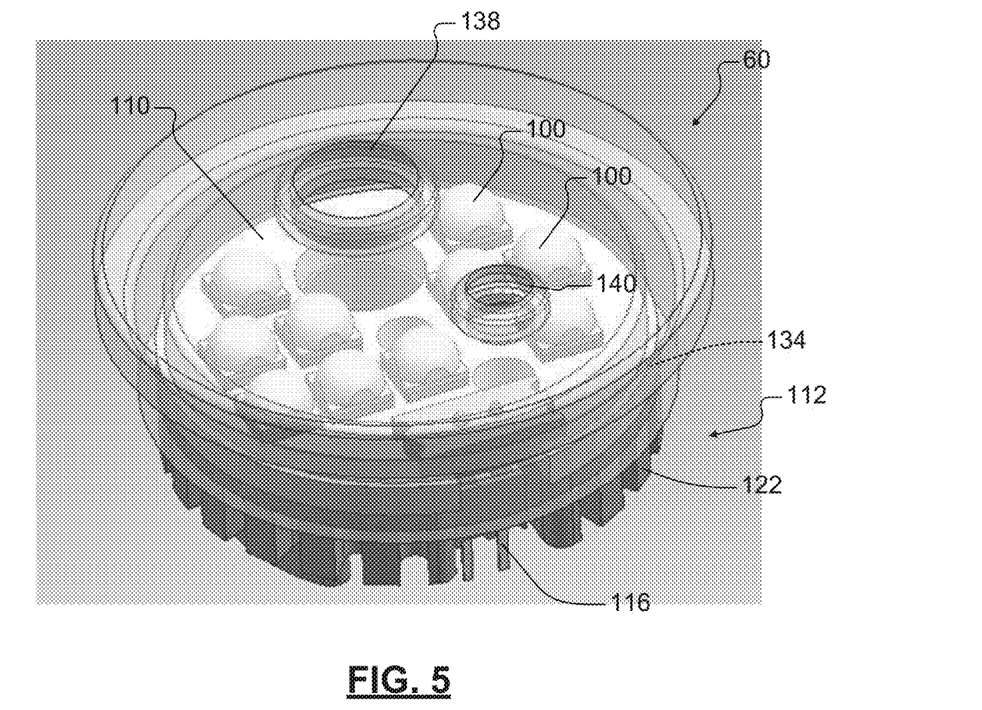

Referring now to FIGS. 4-5, the nozzle stack cap assembly 60 is shown in more detail. In FIG. 4, the nozzle stack cap assembly 60 includes LEDs 100 arranged on a printed circuit board (PCB) 110. In some examples, the PCB 110 has a diameter in a range from 21 mm to 32 mm, although other diameters can be used In some examples, the PCB 110 has a diameter in a range from 25 mm to 28 mm, although other diameters can be used. In some examples, the 6-20 LEDs are arranged on the PCB 110, although additional or fewer LEDs may be used.

The PCB 110 is connected to a body 112. An electrical connector 116 provides a connection to a mating electrical connector (shown in FIG. 6) arranged on the main heater assembly 62. In some examples, the electrical connector 116 includes a pin-type connector. The body 112 may include cooling fins 122 to provide cooling. The PCB 110 includes one or more holes 126 and 128 for delivering liquids and/or gases to the substrate S.

In FIG. 5, a transparent cover 132 includes an opening 134 that is arranged around and engages with a radially outer edge of the PCB 110 and/or the body 112. The transparent cover 132 includes holes 138 and 140 that align with the holes 126 and 128. In some examples, conduits 144 and 146 (shown in FIGS. 6-8) are arranged in the holes 126, 128, 138 and 140 to allow delivery of liquid and/or gas to a facing surface of the substrate S.

Figure 6:
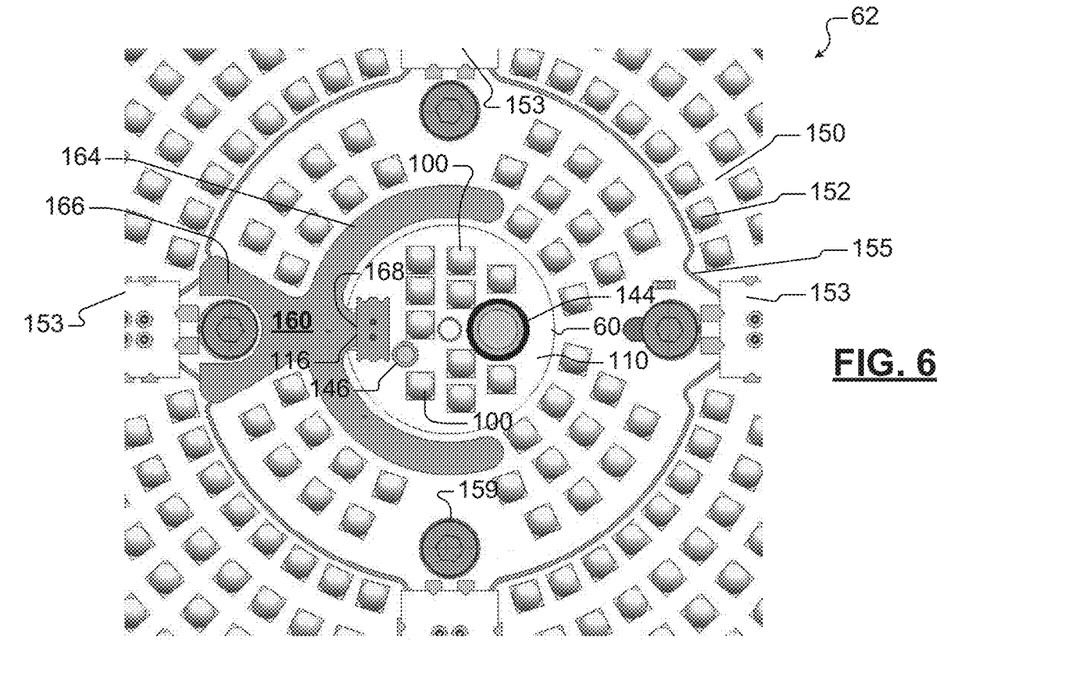
FIG. 6 is a plan view illustrating an example of a main LED heating assembly and a nozzle stack cap assembly according to the present disclosure.
Figure 7:
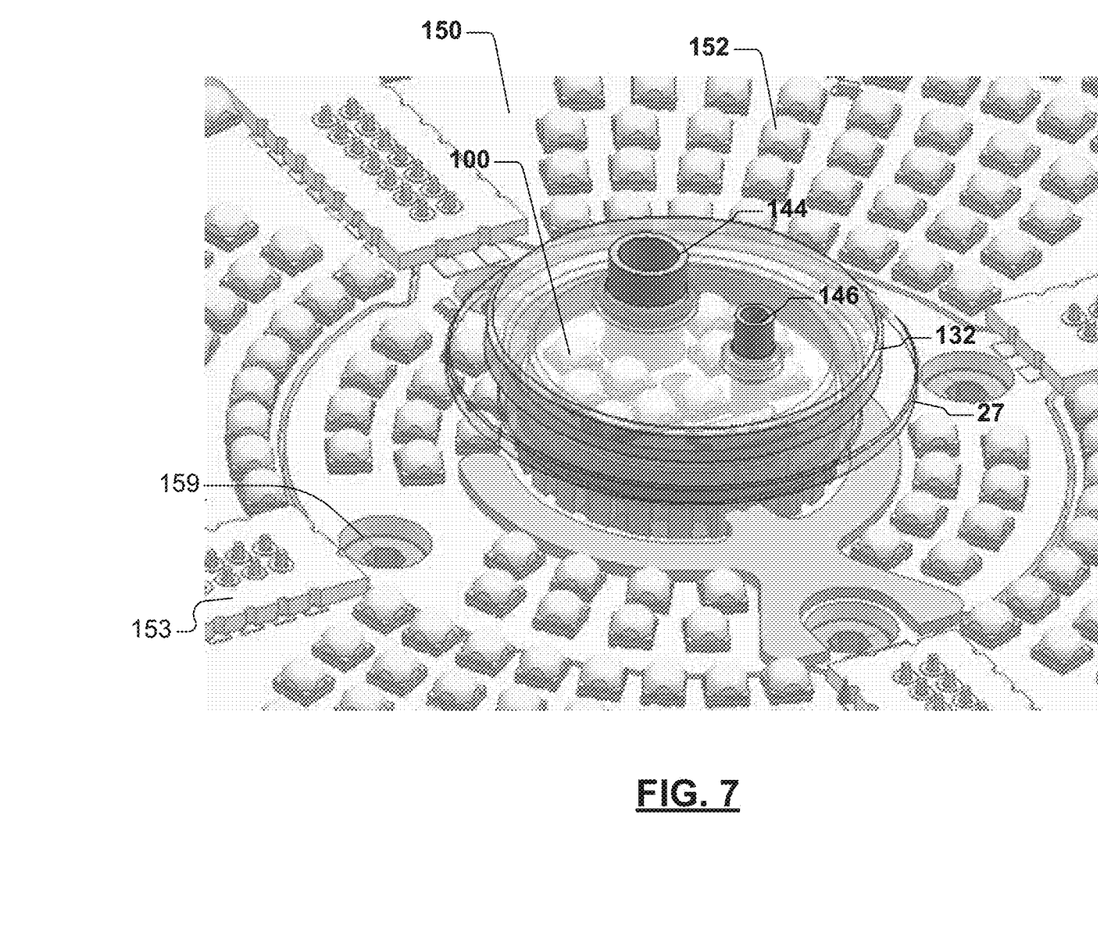
FIG. 7-8 are perspective views illustrating an example of a main LED heating assembly and a nozzle stack cap assembly according to the present disclosure.
Figure 8:
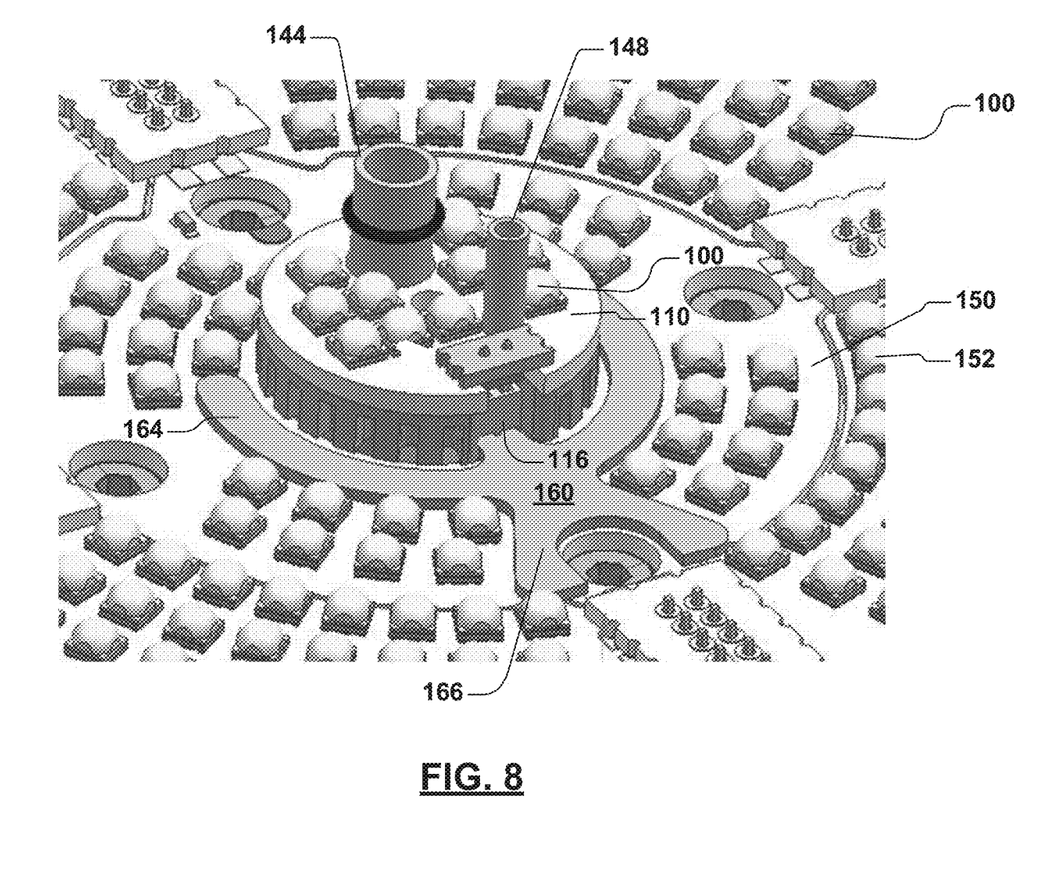

Referring now to FIGS. 6-8, the main heater assembly 62 of the radiant heating assembly 50 is shown in further detail. The main heater assembly 62 includes a printed circuit board (PCB) 150. External connections 153 are connected by traces 155 to provide power to a plurality of LEDs 152. In some examples, the LEDs 152 are arranged and controlled in radial and/or circumferential zones to allow rapid localized heating of the substrate along a moving heat front. The main heater assembly 62 of the radiant heating assembly 50 further includes a printed circuit board (PCB) 160 located at a central portion thereof. In some examples, the PCB 160 includes abutting C-shaped portions 164 and 166. The PCB 160 provides a connector 168 on the C-shaped portion 166 that mates with the electrical connector 116 from the nozzle stack cap assembly 60 to provide power to the LEDs 100 of the nozzle stack cap assembly 60. Fasteners 159 may be used to connect the main heater assembly 62 to a stationary support.

In FIGS. 7-8, the transparent cover 132 and the nozzle stack cap assembly 60 are arranged in the center opening 27 of the transparent plate 25. O-rings 202 may be used to provide liquid and/or gas seals between the transparent cover 132 and the conduits 144 and/or 146.

Figure 9:
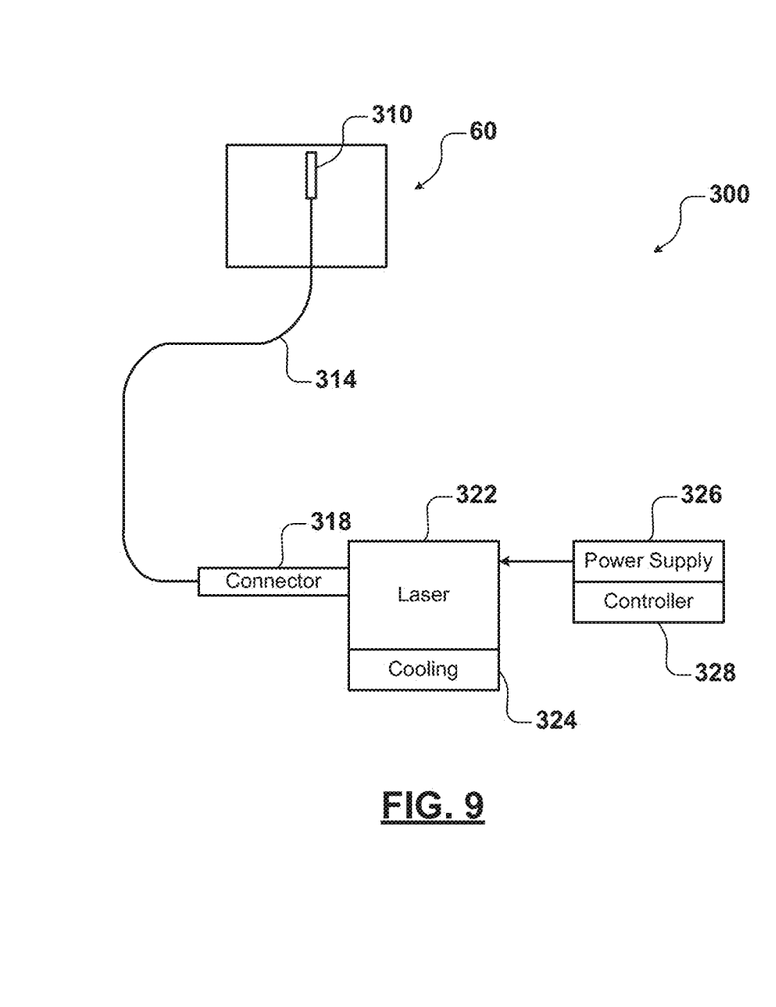
FIG. 9 is a functional block diagram of an example of a laser system including a laser end connector arranged in the nozzle stack cap assembly according to the present disclosure.

Referring now to FIGS. 9-12, the radiant heating assembly 50 may use other sources of radiant heat. In FIG. 9, the nozzle stack cap assembly 60 of the radiant heating assembly 50 produces heat using a laser system 300. The laser system 300 includes a laser end connector 310 that outputs laser light and that is located in the nozzle stack cap assembly 60. Optical fiber 314 connects the laser end connector 310 in the nozzle stack cap assembly 60 to a connector 318, which is connected to a laser 322. A cooling device 324 may be used to cool the laser 322. For example, the cooling device 324 may include a passive cooling device such as a heat sink or an active cooling such as a heat sink and a fan or a coolant block including coolant passages, cooling fluid, a pump and/or coolant fluid source. A power supply 326 and a controller 328 provide power and/or control signals to the laser 322.

Figure 10:
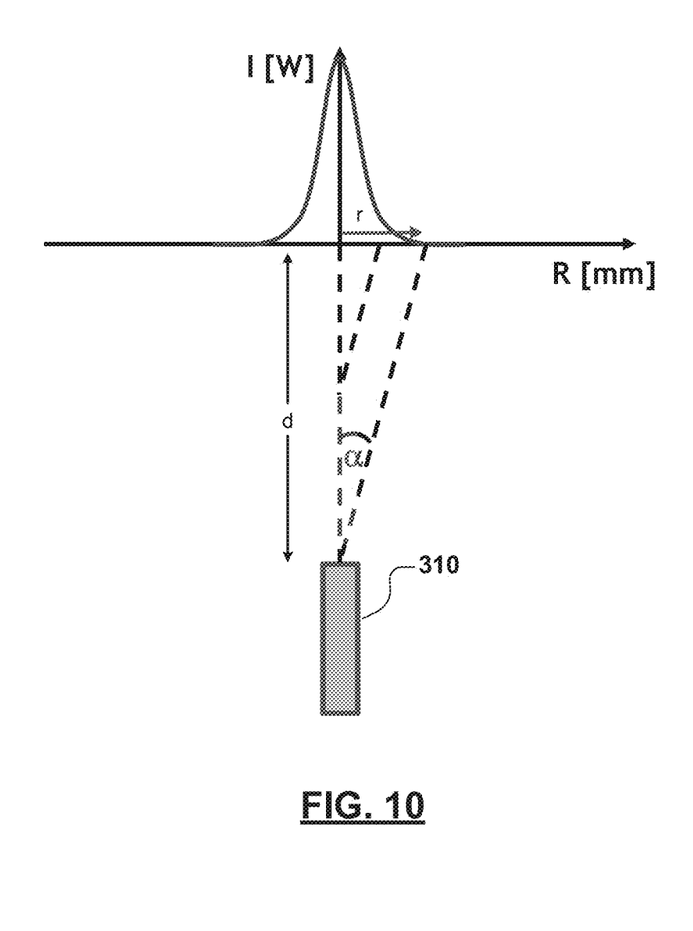
FIG. 10 is a side view illustrating a laser cone of light relative to a position of the laser end connector according to the present disclosure.

In FIG. 10, the laser generates a laser light cone (having a dispersion angle $\alpha$) that is output by the laser end connector 310. A distance d between the laser end connector 310 and a bottom surface of the substrate S determines a radius r of a heated area on the bottom surface of the substrate S. In some examples, the radius r on the bottom surface of the substrate S is in a range from 5 mm to 20 mm, although other values can be used. In some examples, the laser end connector 310 is axially moveable relative to the substrate S and the nozzle stack cap assembly 60 to allow adjustment of the heating area and/or intensity.

Figure 11:
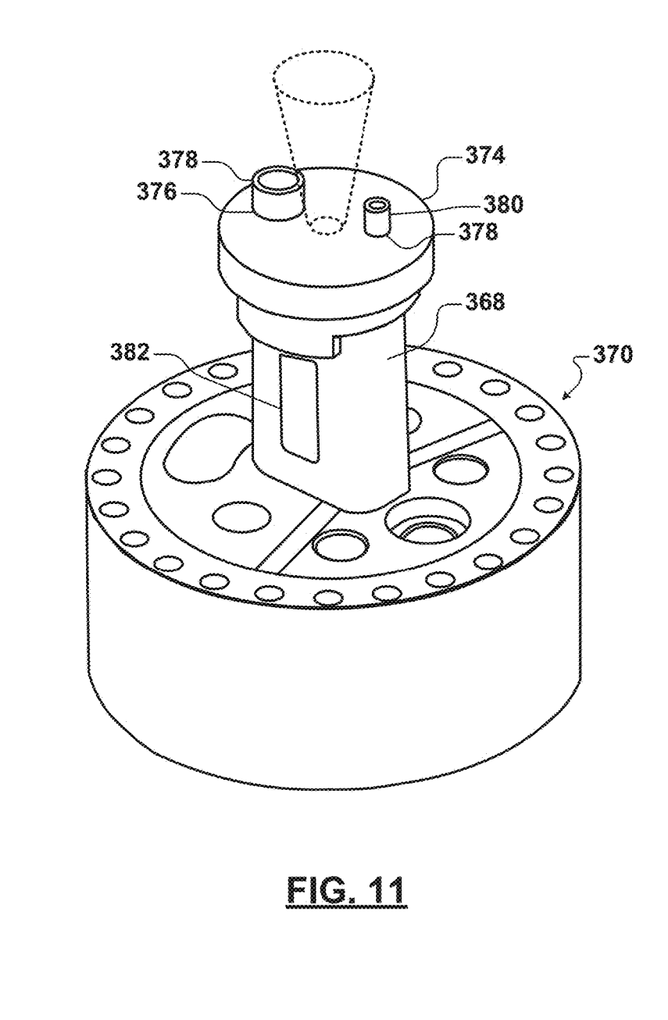
FIG. 11 is a perspective view of an example of a nozzle stack cap assembly including a laser end connector according to the present disclosure.

In FIG. 11, the nozzle stack cap assembly 60 may include a body 368 and a base portion 370. The body 368 supports and positions the laser end connector 310 relative to the base portion 370. A transparent cover 374 is arranged over an end of the laser end connector 310. The transparent cover 374 includes one or more holes 376 and 378 for receiving conduits 379 and 380 for supplying fluid such as liquid and/or gas to the bottom surface of the substrate S. A sliding block 382 is connected to the laser end connector 310 and is slidably received by the base portion 370 to allow adjustment of a relative position of the laser end connector 310. The sliding block 382 may be used to adjust a position of the laser end connector 310 relative to the nozzle stack cap assembly 60 and the bottom surface of the substrate S. The laser end connector 310 outputs a laser light cone 386 through the transparent cover 374.

Figure 12:
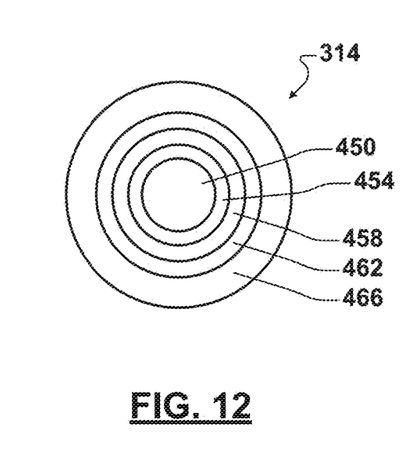
FIG. 12 is a cross-sectional view of an example of an optical fiber according to the present disclosure.

In FIG. 12, an example of the optical fiber 314 is shown and includes a fiber core 450. In some examples, the fiber core 450 is made of fused silica and has a diameter of 400 µm, although other materials and/or dimensions can be used. Cladding 454 is arranged around the fiber core 450. In some examples, the cladding 454 is made of fluorine (F) doped silica and has a diameter of 440 µm, although other materials and/or dimensions can be used. A buffer 458 is arranged around the cladding 454. In some examples, the buffer 458 is made of silicone and has a diameter of 540 µm, although other materials and/or dimensions can be used. A jacket 462 is arranged around the buffer 458. In some examples, the jacket 462 is made of Ethylene tetrafluoroethylene (ETFE) and has a diameter of 750 µm, although other materials and/or dimensions can be used. A protecting tube 466 is arranged around the jacket 462. In some examples, the protecting tube 466 is made of reinforced Kevlar and has a diameter of 3000 µm, although other materials and/or dimensions can be used.

Referring now to FIGS. 13-16, laser end connectors can be mounted in other locations in addition to the central location shown and described above. For example in FIG. 13, one or more laser end connectors 504 are mounted on or above the PCB 150 and below the transparent plate 25 to provide localized heating. The one or more laser end connectors 504 are mounted near a radially outer edge of the PCB 150 in FIG. 13 to allow a bevel edge of the substrate S to be heated. In other examples, the one or more laser end connectors are located in other positions between the center and the radially outer edge of the substrate S. In some examples, light output by the one or more laser end connectors 504 travels through the transparent plate 25 to heat the substrate S during rotation of the substrate S. In some examples, the transparent plate 25 is made of a material that is transparent to a frequency of the light output by the laser.

Figure 13:
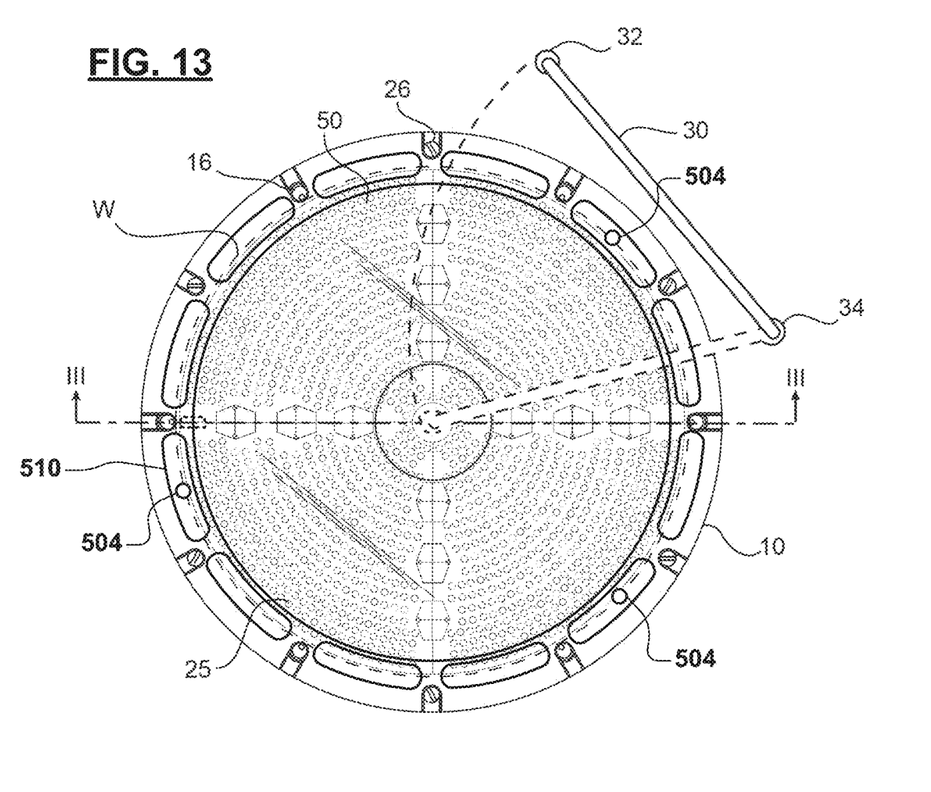
FIGS. 13-16 show examples of other locations for mounting a laser end connector relative to the substrate.

In other examples, the transparent plate 25 may optionally include one or more arcuate openings 510. For example, multiple arcuate openings 510 may be arranged in a circular configuration near a radially outer edge of the transparent plate 25 as shown in FIG. 13. The one or more arcuate openings 510 are arranged in a path travelled by light from the one or more laser end connectors 504 to the substrate S. The one or more arcuate openings 510 in the transparent plate 25 allow the laser light to reach the substrate S unobstructed when they are aligned with the one or more laser end connectors 504 (e.g. without travelling through the transparent plate 25).

Figure 14:
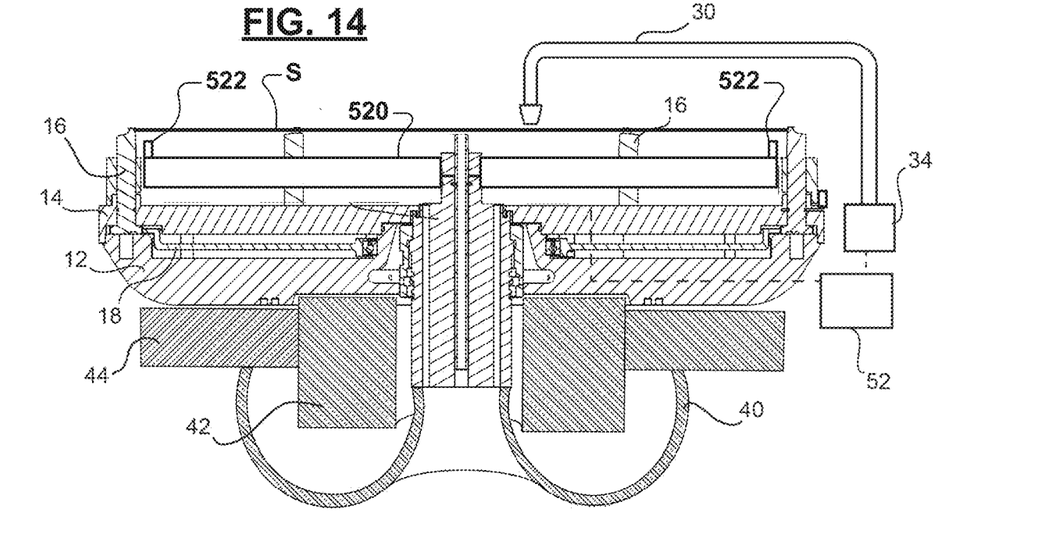

In FIG. 14, one or more laser end connectors 522 are located on or above a stationary surface 520 located below the substrate S if the PCB 150 is not used.

Figure 15:
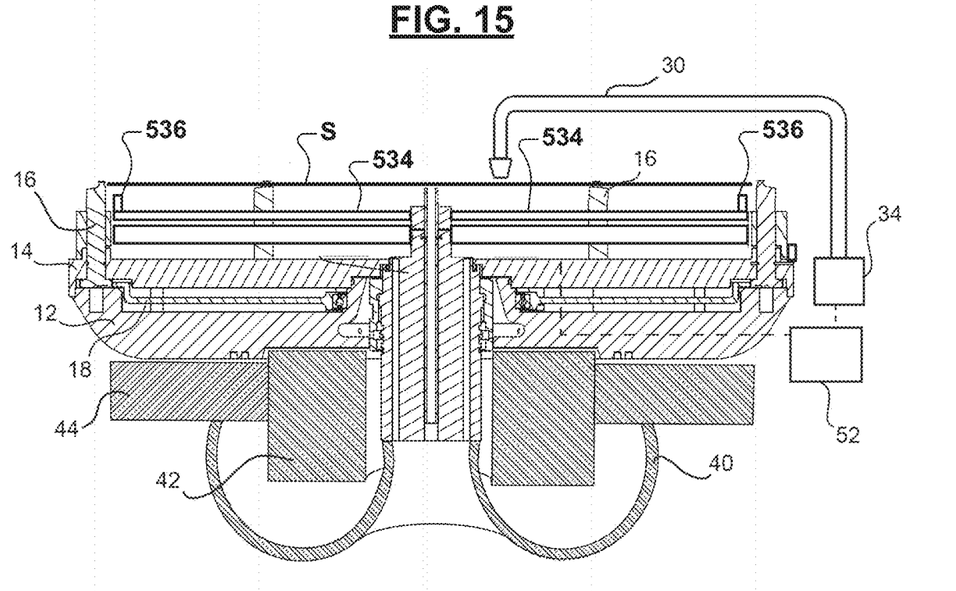

In FIG. 15, instead of mounting the laser end connectors on the stationary surface 520 in FIG. 14, one or more arms 534 can be provided. The one or more arms 534 extend radially outwardly from a center of the spin chuck. Examples of similar arms that are used for liquid delivery are shown and described in commonly-assigned U.S. Pat. Nos. 8,997,764 and 8,821,681, which are hereby incorporated by reference in their entirety.

One or more laser end connectors 536 are attached at one or more radial positions to each of the one or more arms 534. In some examples, the laser end connector 536 is located near a radially outer end of the one or more arms 534, although other positions located between the center of the spin chuck and the radially outer edge of the substrate S may also be used. The one or more arms 534 are stationary or rotate with the spin chuck.

Figure 16:
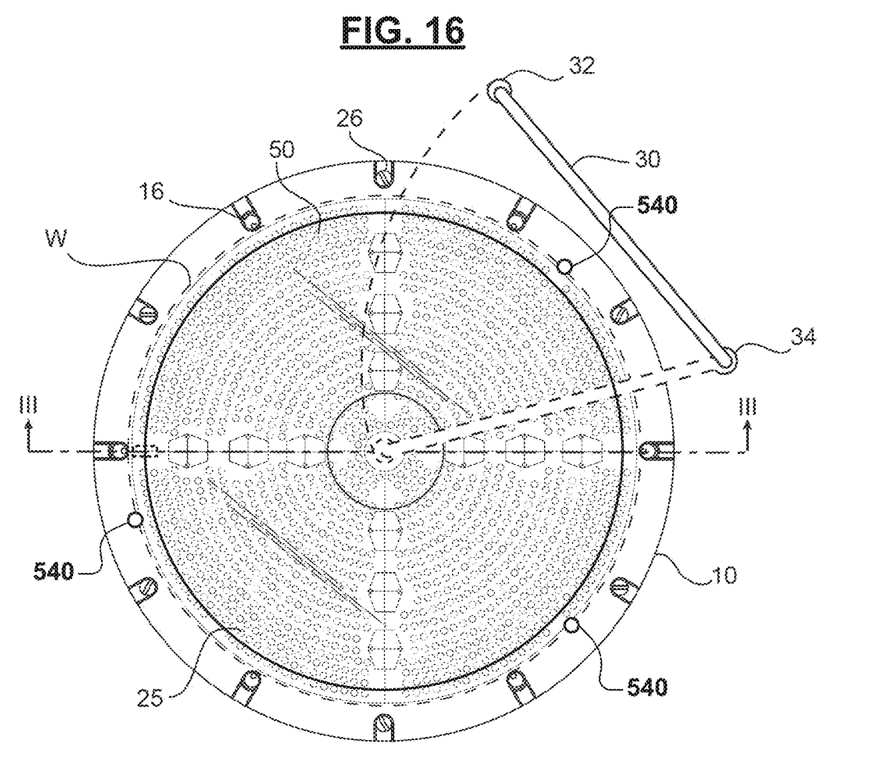

In FIG. 16, one or more laser end connectors 540 are embedded in the transparent plate 25 and project laser light towards the substrate S. In some examples, the one or more laser end connectors 540 are arranged in a circular pattern in the transparent plate 25. The circular pattern may be centered relative to a position of the substrate S and may have a radius less than or equal to the radius of the substrate S.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A substrate processing system to treat a substrate, comprising:
    a spin chuck configured to hold and rotate a substrate;
    a heating assembly configured to heat an opposite surface of the substrate and including:
        a main heater assembly including a first plurality of light emitting diodes (LEDs) arranged on a first printed circuit board (PCB) in a first plane that is spaced from and parallel to a second plane including the substrate; and
    a nozzle stack cap assembly including:
        at least one nozzle to dispense liquid onto a center of a first surface of the substrate; and
        a radiant heat source that is arranged closer to the substrate than the first plane and that is configured to heat the center of the first surface of the substrate.

2. The substrate processing system of claim 1, wherein the radiant heat source is arranged in a third plane that is between the first plane and the second plane.

3. The substrate processing system of claim 1, further comprising a controller to actuate the first plurality of LEDs in radial and circumferential zones to create a moving heat front.

4. The substrate processing system of claim 3, wherein the radiant heat source of the nozzle stack cap assembly is connected to one of the one of the radial and circumferential zones.

5. The substrate processing system of claim 1, wherein the nozzle stack cap assembly includes a second plurality of LEDs that are arranged on a second PCB, wherein the second PCB is arranged in a third plane that is parallel to the first plane and the second plane and that is closer to the second plane than the first plane.

6. The substrate processing system of claim 1, wherein the nozzle stack cap assembly includes:
a transparent cover arranged over the radiant heat source;
a first hole formed in the transparent cover; and
a first conduit passing through the first hole to deliver liquid to the first surface of the substrate.

7. The substrate processing system of claim 6, wherein the nozzle stack cap assembly includes:
a second hole formed in the transparent cover; and
a second conduit passing through the second hole to deliver gas to the first surface of the substrate.

8. The substrate processing system of claim 1, wherein the nozzle stack cap assembly includes:
a second PCB including a second plurality of LEDs;
a body to support the second PCB and defining cooling fins;
a transparent cover arranged over the second PCB;
a first hole formed in the second PCB, the body and the transparent cover;
a second hole formed in the second PCB, the body and the transparent cover;
a first conduit arranged in the first hole to deliver liquid; and
a second conduit arranged in the second hole to deliver gas.

9. The substrate processing system of claim 8, further comprising a connector to connect the second PCB to the first PCB.

10. The substrate processing system of claim 1, wherein the nozzle stack cap assembly includes a body, wherein the radiant heat source includes a laser end connector connected to the body.

11. The substrate processing system of claim 10, wherein the laser end connector is slidably connected to the body to allow axial movement relative to the substrate.

12. The substrate processing system of claim 10, the nozzle stack cap assembly further comprises:
a transparent cover connected to the body;
a first hole formed in the body and the transparent cover;
a second hole formed in the body and the transparent cover;
a first conduit arranged in the first hole to deliver liquid; and
a second conduit arranged in the second hole to deliver gas.

13. The substrate processing system of claim 10, further comprising:
fiber connected to the laser end connector;
a connector connected to the fiber; and
a laser connected to the connector.

14. The substrate processing system of claim 1, further comprising a transparent plate that includes a center opening and that rotates with the spin chuck, wherein the main heater assembly is located below the transparent plate and the nozzle stack cap assembly connected to the main heater assembly and is partially arranged in the center opening.

15. The substrate processing system of claim 14, further comprising a laser end connector to direct light on a radially outer edge of the substrate.

16. The substrate processing system of claim 15, further comprising:
fiber connected to the laser end connector;
a connector connected to the fiber; and
a laser connected to the connector.

17. The substrate processing system of claim 15, wherein the laser end connector is arranged on the PCB.

18. The substrate processing system of claim 17, wherein the transparent plate includes arcuate openings and wherein light generated by the laser end connector passes through the arcuate openings.

\* \* \* \* \*